(12) United States Patent
Huang et al.

(10) Patent No.: US 8,143,812 B2
(45) Date of Patent: Mar. 27, 2012

(54) CLAMP TO ENABLE LOW VOLTAGE SWITCHING FOR HIGH VOLTAGE TERMINAL APPLICATIONS

(75) Inventors: Chienyu Huang, Plano, TX (US);
Abidur Rahman, Allen, TX (US);
Huijuan Li, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 368 days.

(21) Appl. No.: 12/491,609

(22) Filed: Jun. 25, 2009

(65) Prior Publication Data
US 2010/0327777 A1    Dec. 30, 2010

(51) Int. Cl.
*H05B 37/02* (2006.01)

(52) U.S. Cl. .................. 315/297; 315/307; 345/204

(58) Field of Classification Search .................. 315/291, 315/294, 297, 302, 307, 312; 345/204, 211, 345/212; 326/82
See application file for complete search history.

(56) References Cited

U.S. PATENT DOCUMENTS

| | | | |
|---|---|---|---|
| 7,880,404 B2 * | 2/2011 | Deng et al. | 315/291 |
| 2007/0120506 A1 * | 5/2007 | Grant | 315/312 |
| 2010/0283397 A1 * | 11/2010 | Chen et al. | 315/192 |
| 2011/0062872 A1 * | 3/2011 | Jin et al. | 315/122 |

* cited by examiner

*Primary Examiner* — Don Le
(74) *Attorney, Agent, or Firm* — John J. Patti; Wade J. Brady, III; Frederick J. Telecky, Jr

(57) ABSTRACT

An output stage for an LED driver is provided. In particular, a low voltage clamp, which uses several cascode circuits, is provided to protect low voltage switching transistors in the range of two times higher voltage application under both normal and fault conditions. Additionally, a circuit for regulating the bias voltage applied to each of the cascode circuits is provided to prevent damage during startup, while an internal voltage regulator is settling.

18 Claims, 2 Drawing Sheets

US 8,143,812 B2

CLAMP TO ENABLE LOW VOLTAGE SWITCHING FOR HIGH VOLTAGE TERMINAL APPLICATIONS

TECHNICAL FIELD

The invention relates generally to an output stage for a light emitting diode (LED) driver and, more particularly, to a clamp circuit for an output stage.

BACKGROUND

Referring to FIG. 1 of the drawings, the reference numeral 100 generally designates a conventional output stage for a LED driver. In operation, a voltage of about 6.5V is applied through voltage rail 102 to LEDs 104 and 106. These LEDs 104 and 106 are coupled to pins or terminal 108 and 110 of the outputs stage 100 through resistors R1 and R2. The output stage 100 employs cascodes to switch LEDs 104 and 106 "on" and "off" as desired. In particular, transistors Q1 and Q3 (which are preferably both NMOS transistors) operate as the "turn on" transistors or switches for LEDs 104 and 106, receiving enable signals EN1 and EN2. Transistor Q2 (which is also generally an NMOS transistor) receives a bias voltage BIAS at its gate (or control electrode). Additionally, each of transistors Q1, Q2, and Q3 has a parasitic diode D1, D2, and D3 (respectively) between its drain and body. Each of the enable signals EN1 and EN2, though, are generally about 3.3V, which is much lower than the 6.5V on rail 102. Thus, to function properly, the voltage rating of transistors Q1 and Q3 is much greater than 6.5V, which is costly in terms of area.

SUMMARY

A preferred embodiment of the present invention, accordingly, provides an apparatus. The apparatus comprises a plurality of terminals; a clamp circuit including: a voltage divider; a voltage regulator; an inverter having a power terminal, an input terminal, and an output terminal, wherein the power input terminal is coupled to the voltage regulator, and receives an actuation signal at its input terminal; a first transistor having a first passive electrode, a second passive electrode, and a control electrode, wherein the first passive electrode of the first transistor is coupled to the voltage regulator, and wherein the control electrode of the first transistor is coupled to the output terminal of the inverter, and the second passive electrode of the first transistor is coupled to a bias node; and a plurality of cascode circuits, wherein each terminal is coupled to at least one cascode circuit, and wherein each cascode circuit is coupled to the bias node; a back-to-back switch is coupled between the voltage divider and the bias node; a second transistor having a first passive electrode, a second passive electrode, and a control electrode, wherein the first passive electrode of the second transistor is coupled to at least one of the cascode circuits, and wherein the control electrode of the second transistor receives a first enable signal; a third transistor having a first passive electrode, a second passive electrode, and a control electrode, wherein the first passive electrode of the third transistor is coupled to at least one of the cascode circuits, and wherein the control electrode of the third transistor receives a second enable signal; and a fourth transistor having a first passive electrode, a second passive electrode, and a control electrode, wherein the first passive electrode of the fourth transistor is coupled to the second passive electrodes of the second and third transistors, and wherein the control electrode of the fourth transistor receives a bias voltage.

In accordance with a preferred embodiment of the present invention, each of the cascode circuits further comprises: a PMOS transistor having a first parasitic diode between its drain and its body; and an NMOS transistor having a second parasitic diode between its drain and its body, wherein the gate of the NMOS transistor is coupled to the gate of the PMOS transistor.

In accordance with a preferred embodiment of the present invention, the second, third, and fourth transistors are each an NMOS transistor having a parasitic diodes between its drain and its body.

In accordance with a preferred embodiment of the present invention, the clamp circuit further comprises a resistor that is coupled between the voltage regulator and the first passive electrode of the first transistor.

In accordance with a preferred embodiment of the present invention, the first transistor is a PMOS transistor having its source and its body coupled to the voltage regulator.

In accordance with a preferred embodiment of the present invention, the voltage divider further comprises a plurality of resistors coupled in series with one another.

In accordance with a preferred embodiment of the present invention, an apparatus is provided. The apparatus comprises a voltage rail; a first terminal; a second terminal; a clamp circuit including: a voltage divider that is coupled between the voltage rail and ground; a voltage regulator that is coupled to the voltage rail; an inverter having a power terminal, an input terminal, and an output terminal, wherein the power input terminal is coupled to the voltage regulator, and receives an actuation signal at its input terminal; a first transistor having a first passive electrode, a second passive electrode, and a control electrode, wherein the first passive electrode of the first transistor is coupled to the voltage regulator, and wherein the control electrode of the first transistor is coupled to the output terminal of the inverter, and the second passive electrode of the first transistor is coupled to a bias node; a back-to-back switch that is coupled between the voltage divider and the bias node; a first cascode circuit that is coupled to the first terminal and to the bias node; and a second cascode circuit that is coupled to the second terminal and to the bias node; a second transistor having a first passive electrode, a second passive electrode, and a control electrode, wherein the first passive electrode of the second transistor is coupled to at least one of the cascode circuits, and wherein the control electrode of the second transistor receives a first enable signal; a third transistor having a first passive electrode, a second passive electrode, and a control electrode, wherein the first passive electrode of the third transistor is coupled to at least one of the cascode circuits, and wherein the control electrode of the third transistor receives a second enable signal; and a fourth transistor having a first passive electrode, a second passive electrode, and a control electrode, wherein the first passive electrode of the fourth transistor is coupled to the second passive electrodes of the second and third transistors, and wherein the control electrode of the fourth transistor receives a bias voltage.

In accordance with a preferred embodiment of the present invention, the back-to-back switch further comprises: a first PMOS transistor that is coupled to the voltage divider at its source and that is coupled to the input terminal of the inverter at its gate; and a second PMOS transistor that is coupled to the drain of the first PMOS transistor at its drain, that is coupled to the bias node at its source, and that is coupled to the input terminal of the inverter at its gate.

In accordance with a preferred embodiment of the present invention, the voltage on the voltage rail is about 6.5V.

In accordance with a preferred embodiment of the present invention, the voltage output from the voltage regulator is about 3.3V.

In accordance with a preferred embodiment of the present invention, an apparatus is provided. The apparatus comprises a voltage rail; a first terminal; a second terminal; a clamp circuit including: a first resistor that is coupled to the voltage rail; a second resistor that is coupled between the first resistor and ground; a voltage regulator that is coupled to the voltage rail; an inverter having a power terminal, an input terminal, and an output terminal, wherein the power input terminal is coupled to the voltage regulator, and receives an actuation signal at its input terminal; a third resistor that is coupled to the voltage regulator; a first PMOS transistor that is coupled to the third resistor at its source, that is coupled to the voltage regulator at its body, and that is coupled to a bias node at its drain; a second PMOS transistor that is coupled to the node between the first and second resistors at its source and that is coupled to the input terminal of the inverter at its gate; a third PMOS transistor that is coupled to the drain of the second PMOS transistor at its drain, that is coupled to the input terminal of the inverter at its gate, and that is coupled to the bias node at its source; a first NMOS transistor that is coupled to the first terminal at its drain and that is coupled to the bias node at its gate; a fourth PMOS transistor that is coupled to the bias node at its gate and its source and that is coupled to the source of the first NMOS transistor at its drain; a second NMOS transistor that is coupled to the second terminal at its drain and that is coupled to the bias node at its gate; and a fifth PMOS transistor that is coupled to the bias node at its gate and its source and that is coupled to the source of the second NMOS transistor at its drain; a third NMOS transistor that is coupled to the source of the first NMOS transistor at its drain and that receives a first enable signal at its gate; a fourth NMOS transistor that is coupled to the source of the second NMOS transistor at its drain and that receives a second enable signal at its gate; and a fifth NMOS transistor that is coupled to the sources of the third and fourth NMOS transistors at its drain, that receives a bias voltage at its gate, and that is coupled to ground at its source.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
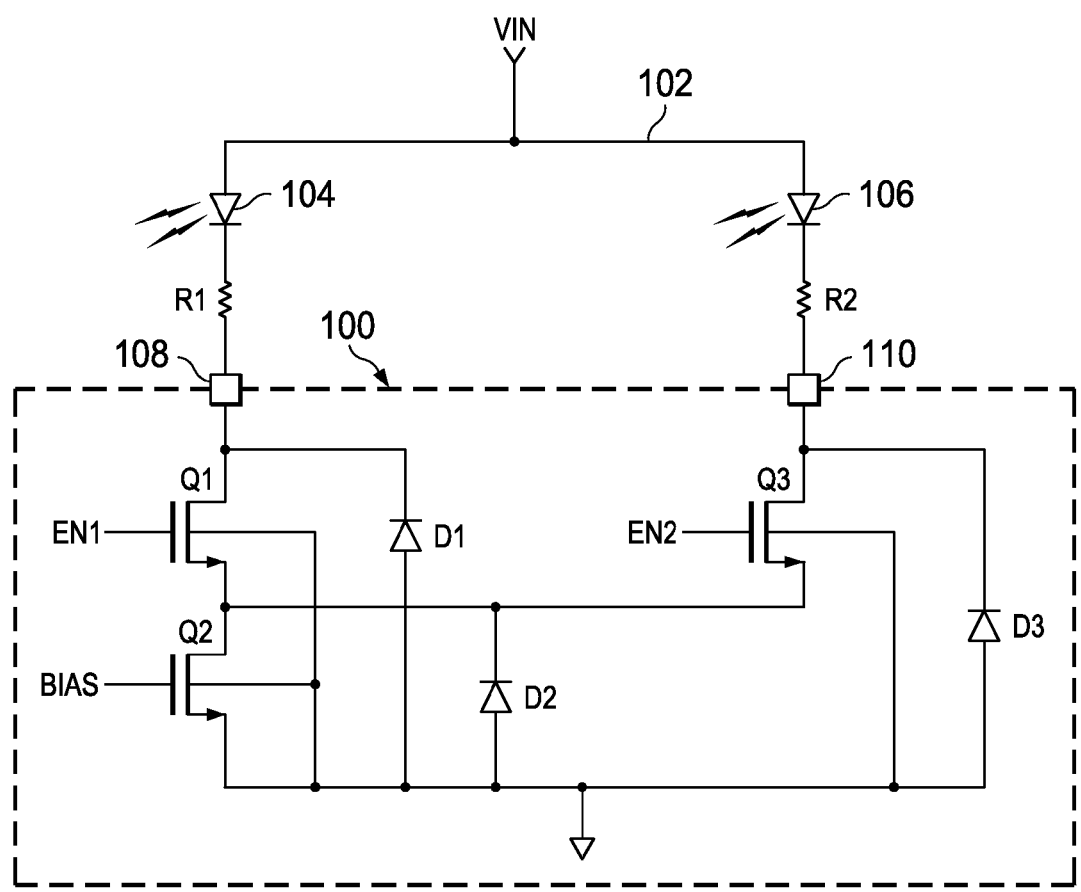
FIG. 1 is an example of a convention output stage for an LED driver.

Refer now to the drawings wherein depicted elements are, for the sake of clarity, not necessarily shown to scale and wherein like or similar elements are designated by the same reference numeral through the several views.

Figure 2:
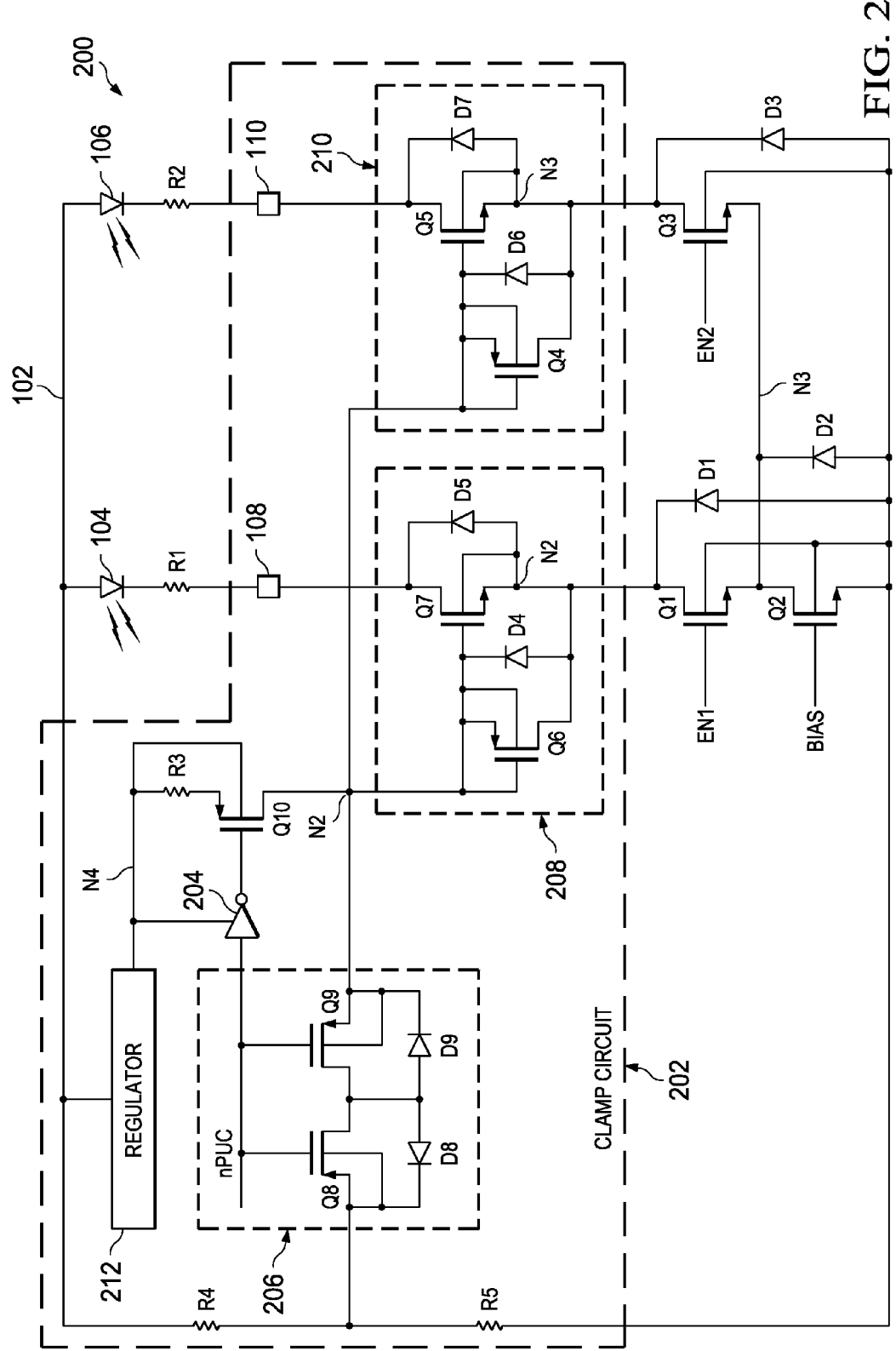
FIG. 2 is an example of an output stage for an LED driver in accordance with a preferred embodiment of the present invention.

Referring to FIG. 2 of the drawings, the reference numeral 200 generally designates an example of an output stage for an LED driver in accordance with a preferred embodiment of the present invention. Similar to stage 100, stage 200 includes transistors Q1, Q2, and Q3, but stage 200 also includes clamp circuit 202 that is coupled between the pins or terminals of stage 200 and transistors Q1 and Q3. Clamp circuit 202 generally comprises back-to-back switch 206, cascode circuits 208 and 210, inverter 204, resistor R3, voltage regulator 212, and a voltage divider (R4 and R5).

In particular, each of transistors Q1 and Q3 has a cascode circuit 208 and 210 coupled between its pin or terminal 108 and 110 and its drain to operate as a "protection cascode." Cascode circuit 208 is coupled between pin 108 and the drain of transistor Q1 and generally comprises transistors Q6 and Q7 (which are preferably a PMOS transistor and an NMOS transistor, respectively). Transistor Q6 includes a parasitic diode D4 between its drain (or passive electrode) and body, and transistor Q6 is coupled to bias node N1 at its gate (or control electrode) and source (or passive electrode), while its drain is coupled to the drain of transistor Q1. Transistor Q7 includes a parasitic diode D5 between its drain and body, and transistor Q6 is coupled to the bias electrode at its gate, pin 108 at its drain, and the drain of transistor Q1 at its source. Additionally, cascode circuit 210 is coupled between pin 110 and the drain of transistor Q3, having the same general configuration as cascode circuit 208 (with transistors Q4 and Q5 and parasitic diodes D6 and D7 corresponding generally to transistors Q6 and Q7 and parasitic diodes D4 and D5, respectively).

In operation, instead of being switched "on" and "off," transistors Q7 and Q5 are biased with a generally constant voltage (preferably about 3.3V) from bias node N1, regardless of channel conditions (enable or disable). The middle point (about 3.3V) of pin voltage (about 6.5V) is chosen to be this generally constant voltage. When either is enabled (enable signals EN1 and/or EN2 are logic high), the voltages at the node N2 and/or N3 relative to ground is about 3.3V minus the gate-source voltage drop across transistors Q7 and/or Q5. When the channel is disabled (enable signals EN1 and/or EN2 are logic low), the voltage at the node N2 and/or N3 relative to ground is about 3.3V plus/minus the voltage drop across one diode (D4/D5 and/or D6/D7). If pin 108 and/or 110 is faulted to ground, transistors Q6 and Q7 and/or Q4 and Q5 prevent current from flowing from nodes N2 and/or N3 to pins 108 and/or 110.

Proper regulation of the voltage on bias node N1 is also important. Regulation of the voltage at node N1 is accomplished through the use of regulator 212, inverter 204, back-to-back switch 206, transistor Q10, and resistor R3. During startup the voltage at bias node N1 is provided by voltage divider (resistors R4 and R5 which are coupled in series with one another between voltage rail 102 and ground) through transistors Q8 and Q9 (which are preferably PMOS transistors with parasitic diodes D8 and D9, respectively, between their respective drains and bodies). Once regulator 212 has stabilized to a desired voltage (preferably about 3.3V), signal nPUC transitions to logic high, turning off transistors Q8 and Q9 and turning on transistor Q10 (which is preferably a PMOS transistor) via inverter 204. Once activated, the bias voltage at node N1 is provided through resistor R3 and transistor Q10.

By implementing stage 200, there are several advantages. For example, by using 26V Drain Extended MOS (DEMOS) transistors with stage 100, a layout would have and area of about 432,361 μm², but by using stage 200, the layout would have an area of about 159,716 μm², which is a savings of about 63%. Additionally, for example, because of the clamp 202, lower voltages can be tolerated, allowing lower voltages at pins 108 and/or 110, while achieving better output current accuracy. For the same previous example, by using 26V DEMOS transistors with stage 100, minimum voltage at pins 108 and/or 110 is 1.1V with 20% accuracy. But by using stage 200, it was made possible to lower minimum voltage at pins 108 and/or 110 to 0.5V while achieving 10% accuracy.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a plurality of terminals;
   a clamp circuit including:
      a voltage divider;
      a voltage regulator;
      an inverter having a power terminal, an input terminal, and an output terminal, wherein the power input terminal is coupled to the voltage regulator, and receives an actuation signal at its input terminal;
      a first transistor having a first passive electrode, a second passive electrode, and a control electrode, wherein the first passive electrode of the first transistor is coupled to the voltage regulator, and wherein the control electrode of the first transistor is coupled to the output terminal of the inverter, and the second passive electrode of the first transistor is coupled to a bias node; and
      a plurality of cascode circuits, wherein each terminal is coupled to at least one cascode circuit, and wherein each cascode circuit is coupled to the bias node;
      a back-to-back switch is coupled between the voltage divider and the bias node;
   a second transistor having a first passive electrode, a second passive electrode, and a control electrode, wherein the first passive electrode of the second transistor is coupled to at least one of the cascode circuits, and wherein the control electrode of the second transistor receives a first enable signal;
   a third transistor having a first passive electrode, a second passive electrode, and a control electrode, wherein the first passive electrode of the third transistor is coupled to at least one of the cascode circuits, and wherein the control electrode of the third transistor receives a second enable signal; and
   a fourth transistor having a first passive electrode, a second passive electrode, and a control electrode, wherein the first passive electrode of the fourth transistor is coupled to the second passive electrodes of the second and third transistors, and wherein the control electrode of the fourth transistor receives a bias voltage.

2. The apparatus of claim 1, wherein each of the cascode circuits further comprises:
   a PMOS transistor having a first parasitic diode between its drain and its body; and
   an NMOS transistor having a second parasitic diode between its drain and its body, wherein the gate of the NMOS transistor is coupled to the gate of the PMOS transistor.

3. The apparatus of claim 1, wherein the second, third, and fourth transistors are each an NMOS transistor having a parasitic diodes between its drain and its body.

4. The apparatus of claim 1, wherein the clamp circuit further comprises a resistor that is coupled between the voltage regulator and the first passive electrode of the first transistor.

5. The apparatus of claim 1, wherein the first transistor is a PMOS transistor having its source and its body coupled to the voltage regulator.

6. The apparatus of claim 1, wherein the voltage divider further comprises a plurality of resistors coupled in series with one another.

7. An apparatus comprising:
   a voltage rail;
   a first terminal;
   a second terminal;
   a clamp circuit including:
      a voltage divider that is coupled between the voltage rail and ground;
      a voltage regulator that is coupled to the voltage rail;
      an inverter having a power terminal, an input terminal, and an output terminal, wherein the power input terminal is coupled to the voltage regulator, and receives an actuation signal at its input terminal;
      a first transistor having a first passive electrode, a second passive electrode, and a control electrode, wherein the first passive electrode of the first transistor is coupled to the voltage regulator, and wherein the control electrode of the first transistor is coupled to the output terminal of the inverter, and the second passive electrode of the first transistor is coupled to a bias node;
      a back-to-back switch that is coupled between the voltage divider and the bias node;
      a first cascode circuit that is coupled to the first terminal and to the bias node; and
      a second cascode circuit that is coupled to the second terminal and to the bias node;
   a second transistor having a first passive electrode, a second passive electrode, and a control electrode, wherein the first passive electrode of the second transistor is coupled to at least one of the cascode circuits, and wherein the control electrode of the second transistor receives a first enable signal;
   a third transistor having a first passive electrode, a second passive electrode, and a control electrode, wherein the first passive electrode of the third transistor is coupled to at least one of the cascode circuits, and wherein the control electrode of the third transistor receives a second enable signal; and
   a fourth transistor having a first passive electrode, a second passive electrode, and a control electrode, wherein the first passive electrode of the fourth transistor is coupled to the second passive electrodes of the second and third transistors, and wherein the control electrode of the fourth transistor receives a bias voltage.

8. The apparatus of claim 7, wherein each of the first and second cascode circuits further comprises:
   a NMOS transistor having a first parasitic diode between its source and its body, wherein the drain is coupled to the one of the first and second terminals, wherein its body is coupled to its source, and wherein its source is coupled to the first passive electrode of one of the second and third transistors, and wherein it gate is coupled to the bias node; and an PMOS transistor having a second parasitic diode between its drain and its body, wherein the drain is coupled to the source of the NMOS transistor, wherein its body is coupled to its source, and wherein its source and its gate are coupled to the bias node.

9. The apparatus of claim 7, wherein the second, third, and fourth transistors are each an NMOS transistor having a parasitic diodes between its drain and its body.

10. The apparatus of claim 7, wherein the clamp circuit further comprises a resistor that is coupled between the voltage regulator and the first passive electrode of the first transistor.

11. The apparatus of claim 7, wherein the first transistor is a PMOS transistor having its source and its body coupled to the voltage regulator.

12. The apparatus of claim 7, wherein the voltage divider further comprises a plurality of resistors coupled in series with one another.

13. The apparatus of claim 7, wherein the back-to-back switch further comprises:
   a first PMOS transistor that is coupled to the voltage divider at its source and that is coupled to the input terminal of the inverter at its gate; and
   a second PMOS transistor that is coupled to the drain of the first PMOS transistor at its drain, that is coupled to the bias node at its source, and that is coupled to the input terminal of the inverter at its gate.

14. The apparatus of claim 7, wherein the voltage on the voltage rail is about 6.5V.

15. The apparatus of claim 7, wherein the voltage output from the voltage regulator is about 3.3V.

16. An apparatus comprising:
   a voltage rail;
   a first terminal;
   a second terminal;
   a clamp circuit including:
      a first resistor that is coupled to the voltage rail;
      a second resistor that is coupled between the first resistor and ground;
      a voltage regulator that is coupled to the voltage rail;
      an inverter having a power terminal, an input terminal, and an output terminal, wherein the power input terminal is coupled to the voltage regulator, and receives an actuation signal at its input terminal;
      a third resistor that is coupled to the voltage regulator;
      a first PMOS transistor that is coupled to the third resistor at its source, that is coupled to the voltage regulator at its body, and that is coupled to a bias node at its drain;
      a second PMOS transistor that is coupled to the node between the first and second resistors at its source and that is coupled to the input terminal of the inverter at its gate;
      a third PMOS transistor that is coupled to the drain of the second PMOS transistor at its drain, that is coupled to the input terminal of the inverter at its gate, and that is coupled to the bias node at its source;
      a first NMOS transistor that is coupled to the first terminal at its drain and that is coupled to the bias node at its gate;
      a fourth PMOS transistor that is coupled to the bias node at its gate and its source and that is coupled to the source of the first NMOS transistor at its drain;
      a second NMOS transistor that is coupled to the second terminal at its drain and that is coupled to the bias node at its gate; and
      a fifth PMOS transistor that is coupled to the bias node at its gate and its source and that is coupled to the source of the second NMOS transistor at its drain;
   a third NMOS transistor that is coupled to the source of the first NMOS transistor at its drain and that receives a first enable signal at its gate;
   a fourth NMOS transistor that is coupled to the source of the second NMOS transistor at its drain and that receives a second enable signal at its gate; and
   a fifth NMOS transistor that is coupled to the sources of the third and fourth NMOS transistors at its drain, that receives a bias voltage at its gate, and that is coupled to ground at its source.

17. The apparatus of claim 14, wherein the voltage on the voltage rail is about 6.5V.

18. The apparatus of claim 14, wherein the voltage output from the voltage regulator is about 3.3V.

* * * * *